United States Patent
Quek et al.

(10) Patent No.: US 6,849,481 B1
(45) Date of Patent: Feb. 1, 2005

(54) THYRISTOR-BASED SRAM AND METHOD FOR THE FABRICATION THEREOF

(75) Inventors: Elgin Quek, Singapore (SG); Pradeep Ramachandramurthy Yelehanka, Singapore (SG); Jia Zhen Zheng, Singapore (SG); Tommy Lai, Hong Kong (CN); Weining Li, Shanghai (CN)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/628,912

(22) Filed: Jul. 28, 2003

(51) Int. Cl.$^7$ ............................................ H01L 21/332
(52) U.S. Cl. ......................... 438/135; 438/133; 438/138
(58) Field of Search ................................ 438/133, 135, 438/138, 241, 268

(56) References Cited

U.S. PATENT DOCUMENTS

| | | | | |
|---|---|---|---|---|
| 6,048,738 A | * | 4/2000 | Hsu et al. ........................ | 438/3 |
| 6,229,161 B1 | | 5/2001 | Nemati et al. | |
| 6,448,586 B1 | * | 9/2002 | Nemati et al. ............... | 257/133 |
| 6,462,359 B1 | * | 10/2002 | Nemati et al. ............... | 257/107 |
| 6,528,356 B2 | * | 3/2003 | Nemati et al. ............... | 438/135 |
| 6,559,470 B2 | * | 5/2003 | Tsu-Jae ......................... | 257/17 |
| 6,600,173 B2 | * | 7/2003 | Tiwari ........................ | 438/118 |
| 6,653,175 B1 | * | 11/2003 | Nemati et al. ............... | 438/133 |
| 6,653,665 B2 | * | 11/2003 | Kajiyama .................... | 438/135 |
| 6,686,612 B1 | * | 2/2004 | Horch et al. ................. | 257/133 |
| 6,690,038 B1 | * | 2/2004 | Cho et al. .................... | 257/133 |
| 6,713,791 B2 | * | 3/2004 | Hsu et al. .................... | 257/200 |
| 6,727,528 B1 | * | 4/2004 | Robins et al. ............... | 257/133 |
| 6,756,612 B1 | * | 6/2004 | Nemati et al. ............... | 257/156 |
| 6,768,166 B2 | * | 7/2004 | Hagemeyer ................. | 257/324 |
| 6,781,888 B1 | * | 8/2004 | Horch et al. ........... | 365/189.09 |
| 6,790,713 B1 | * | 9/2004 | Horch ......................... | 438/135 |

* cited by examiner

*Primary Examiner*—John F. Niebling
*Assistant Examiner*—Walter L. Lindsay, Jr.
(74) *Attorney, Agent, or Firm*—Mikio Ishimaru

(57) ABSTRACT

A method for manufacturing an integrated circuit structure includes providing a semiconductor substrate and forming a thyristor thereon. The thyristor has at least four layers, with three P-N junctions therebetween. At least two of the layers are formed horizontally and at least two of the layers are formed vertically. A gate is formed adjacent at least one of the vertically formed layers. An access transistor is formed on the semiconductor substrate, and an interconnect is formed between the thyristor and the access transistor.

10 Claims, 9 Drawing Sheets

THYRISTOR-BASED SRAM AND METHOD FOR THE FABRICATION THEREOF

TECHNICAL FIELD

The present invention relates generally to semiconductor integrated circuit devices and methods for the production thereof, and more particularly to thyristor-based SRAM devices.

BACKGROUND ART

Electronic equipment, such as televisions, telephones, radios, and computers, is constructed using semiconductor microprocessors, integrated circuits, memory chips, and the like. These semiconductor components are typically fabricated on a semiconductor substrate and are constructed using various microelectronic devices such as transistors, capacitors, diodes, resistors, and so forth. Each microelectronic device is typically a pattern of conductor, semiconductor, and insulator regions formed on the semiconductor substrate.

The electronics industry continues to strive for increasingly higher-powered and higher-functioning circuits by device miniaturization and by creating multifunction devices on a single semiconductor chip or die.

Very large-scale integrated circuits on small areas of silicon wafers are manufactured through a series of steps carried out in a particular order. The main objectives include obtaining a device that occupies as small an area as possible and consumes low levels of power using low voltage supply levels, while performing at speeds comparable to speeds realized by much larger devices. To obtain these objectives, steps in the manufacturing process are closely controlled to ensure that rigid requirements, for example, of exacting tolerances, quality materials, and clean environment, are realized.

An important part in the circuit construction and manufacture of semiconductor devices concerns data storage, or semiconductor memories; the circuitry used to store digital information. The construction and formation of such memory circuitry typically involves forming at least one storage element and forming associated circuitry designed to access the stored information. In applications where circuit space, power consumption, circuit speed, and reliability are primary design goals, the construction and layout of memory devices can be very important.

Dynamic read/write random-access memory ("DRAM") is a type of volatile memory in which the data stored at each location is periodically refreshed by reading it and then writing it back again to the same location, or else it disappears. Static read/write random-access memory ("SRAM") is a type of volatile memory in which the data, once it is written to a memory location, remains stored there as long as power is applied to the memory chip (unless, of course, the data is deliberately changed by replacing it with new data).

SRAM and DRAM often compromise one or more of the primary design goals of smaller circuit space, lower power consumption, and faster circuit speed. For instance, some SRAMs include circuit structures that compromise at least one of these primary design goals. An example is a conventional SRAM based on a four-transistor ("4T") cell, or a six-transistor ("6T") cell, that has four cross-coupled transistors or two transistors and two resistors, plus two cell-access transistors. Such cells have the advantage that they are compatible with mainstream complimentary metal oxide semiconductor ("CMOS") technology, consume relatively low levels of standby power, operate at low voltage levels, and perform at relatively high speeds. However, the 4T and 6T cells are conventionally configured using a large cell area; and this large area significantly and undesirably limits the maximum density of such SRAMs.

Other SRAM cell designs are based on negative differential resistance ("NDR") devices. These usually consist of at least two active elements, including the NDR device. The structure and operating characteristics of the NDR device are particularly important to the overall performance of this type of SRAM cell. A variety of NDR devices has been introduced, ranging from a simple bipolar transistor to complicated quantum-effect devices. The biggest advantage of the NDR-based memory cell is the potential of having a cell area smaller than that of 4T and 6T memory cells because of the smaller number of active devices and interconnections needed in the NDR design.

Conventional NDR-based SRAM cells, however, have many problems that have inhibited their use in commercial SRAM products. Some of these problems include: high standby power consumption due to the large current needed in one or both of the stable memory states of the cell; excessively high or excessively low voltage levels needed for the cell operation; stable states that are too sensitive to manufacturing variations and provide poor noise-margins; limitations in access speed due to slow switching from one stable state to the other; and manufacturability and yield issues due to complicated fabrication processing.

One NDR device is the "thyristor" (from the Greek thyra, meaning "door", which suggests something that is either open or closed, and thus either on or off). Thyristors are widely used in power switching applications because the current densities carried by such devices can be very high when in their "on" state.

A thyristor is a four-layer semiconductor device consisting of alternating P-type and N-type semiconductor materials (i.e., "PNPN"), with three P—N junctions. Thyristors usually have three electrodes: an anode, a cathode, and a gate (or control electrode).

A thyristor can be turned on by an initial current at the gate, and once it is turned on it then does not require any more control (gate) current to continue to conduct. Instead, it will continue to conduct until a minimum holding current is no longer maintained between the anode and cathode, or until the voltage between the anode and the cathode is reversed.

A thyristor can thus switch or control large amounts of power using but a small triggering (or control) current or voltage. Thyristors, then, act like a semiconductor analog of a mechanical switch—the two stable states are "on" and "off," with nothing in between. Thyristors are used, among many applications, in motor speed controls, light dimmers, pressure-control systems, and liquid-level regulators.

For use in electronic applications, however, a significant difficulty with thyristor devices is that once switched to their on state, they remain in this state until the current is reduced below the device holding current. Also, in general, when the main thyristor current is interrupted (to turn the thyristor off), the time required for the thyristor to return to the off state is largely determined by the lifetimes of the current carriers in the device, and in electronic terms this can be a long time.

This inability to switch the device off without interrupting the current, and the associated slow switching speed, are significant problems in many applications and have resulted in many attempts to modify the device structures so that they can be actively and rapidly switched off.

A prior design directed to these concerns appears in U.S. Pat. Nos. 6,229,161 and 6,448,586 (both to Nemati et al.). The descriptions are directed to capacitively-coupled NDR devices such as thyristors, and to circuit applications for such structures. These devices are described as having advantages for use in designs that need NDR devices having improved on/off switching speeds and a low holding current when in the on state. They are said to be unlike many NDR devices such as conventional thyristor structures that slowly turn off due to the saturation of their junctions in the on state, and/or which may not turn off at all until the current is reduced below the holding current. Instead, the devices in these patents are directed to capacitively-coupled thyristor devices that quickly switch between a current-passing mode and a current-blocking mode in response to a capacitively-coupled activation signal that is presented adjacent a particular region of the capacitively-coupled NDR device. The switch or change from one state to the other occurs using a relatively low voltage, and the devices can be implemented in a relatively small area.

A thyristor-based random access memory ("T-RAM") array having a plurality of such T-RAM cells could have a density equivalent to that of DRAM arrays and a speed equivalent to that of SRAM arrays. Hence, such a T-RAM array could provide the advantages afforded by both SRAM and DRAM arrays. These advantages make such a T-RAM attractive for possible use in future generations of high speed, low-voltage, and high-density memories.

However, the T-RAM cell disclosed in these patents presents several major drawbacks. For example, the thyristor SRAM cell (T-RAM) sits in a P– well in a bulk silicon substrate. This results in a large difference in elevation between the contact on the top P+ region of the thyristor and other contacts in the device.

Also, additional masking, implantation and diffusion steps are needed to form the bottom N+ region of the thyristor.

There is also potential incompatibility with salicidation. Additionally, difficulties can arise in controlling the dimensions of the vertical pillar and reproducing these dimensions for each T-RAM cell in a T-RAM array.

Also, due to the existence of a vertical thyristor in each T-RAM cell, the T-RAM cells as a whole are not planar and are therefore difficult to scale to larger configurations.

Additionally, since each T-RAM cell is fabricated prior to or after fabricating other devices (such as positive-channel metal-oxide semiconductor ("PMOS") and negative-channel metal-oxide semiconductor ("NMOS") supporting devices) that are connected to it, extra fabrication steps and increased manufacturing costs are incurred.

Thus, while there is a growing trend to realize an SRAM cell by using the T-RAM combination of a PNPN junction connected to an NMOS transistor for ultra-high cell density, the incompatibility with conventional bulk CMOS processing makes such embedded SRAM design difficult.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit structure. A semiconductor substrate is provided and a thyristor is formed thereon. The thyristor has at least four layers, with three P-N junctions therebetween. At least two of the layers are formed horizontally on the semiconductor substrate and at least two of the layers are formed vertically on the semiconductor substrate. A gate is formed adjacent to at least one of the vertically formed layers. An access transistor is formed on the semiconductor substrate, and an interconnect is formed between the thyristor and the access transistor. Thus, there is provided a thyristor-based SRAM and advanced methods for the fabrication thereof that alleviate the contact-formation problems due to the large height difference among contacts in the existing cell, that reduce the number of implantation steps, and that allow salicidation. Further, the advanced device structures and methods use existing bulk processing techniques, thereby avoiding additional complexity and expense in the fabrication and manufacturing processes so as to be highly manufacturable, reliable, scalable, repeatable and economical to produce.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. Also, the drawings showing embodiments of the apparatus are semi-diagrammatic and not to scale and, particularly, some of the dimensions are for the clarity of presentation and may be shown exaggerated in the FIGs.

The term "horizontal" as used herein is defined as a plane parallel to the conventional plane or surface of a wafer or substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane. The term "processing" as used herein includes deposition of material or photoresist, patterning, exposure, development, etching, cleaning, and/or removal of the material or photoresist as required in forming a described structure.

Figure 1B:
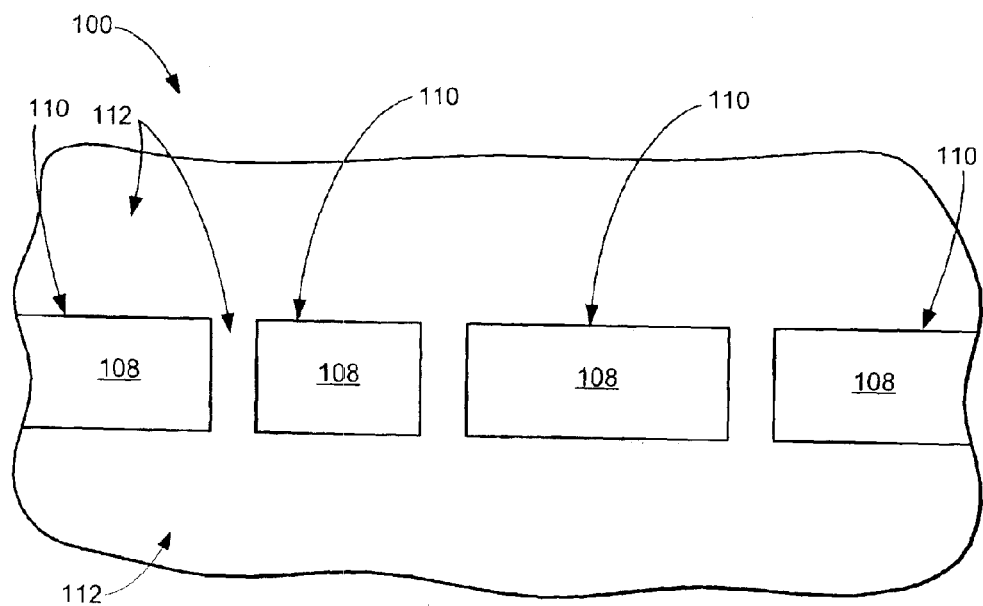
FIG. 1B is a layout view of the structure of FIG. 1A.
Figure 1A:
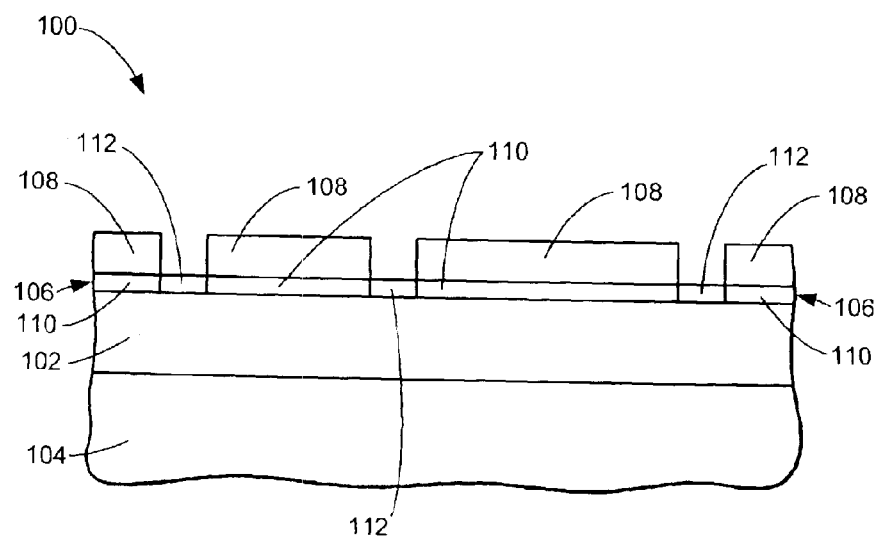
FIG. 1A is a cross-sectional side view of a silicon wafer in the first stages of processing in accordance with the present invention.

Referring now to FIG. 1A, therein is shown a cross-sectional or side view of a silicon ("Si") wafer 100 in the first stages of processing to fabricate a static read/write random-access memory ("SRAM") that is thyristor-based ("T-RAM").

The thyristor is a negative differential resistance ("NDR") device having alternating P-type and N-type ("PNPN") semiconductor materials. The region of the Si wafer 100 shown in the drawing figures is a portion of a silicon-on-insulator ("SOI") region, in which a layer of buried silicon oxide ("SiO$_2$") 102 has been formed on the underlying Si semiconductor substrate 104 of the Si wafer 100.

The buried SiO$_2$ 102 has an upper layer 106 of Si formed thereon. A mask 108 is then patterned and formed on top of the upper layer 106 of Si. The mask 108 defines active regions 1110 therebeneath and isolation regions 112 therebetween and therearound. The isolation regions 112 are formed by etching off Si, then depositing oxide to fill the trenches formed in the upper layer 106 of Si where it is not protected by the mask 108.

Referring now to FIG. 1B, therein is shown a layout view of the structure of FIG. 1A.

Figure 2B:
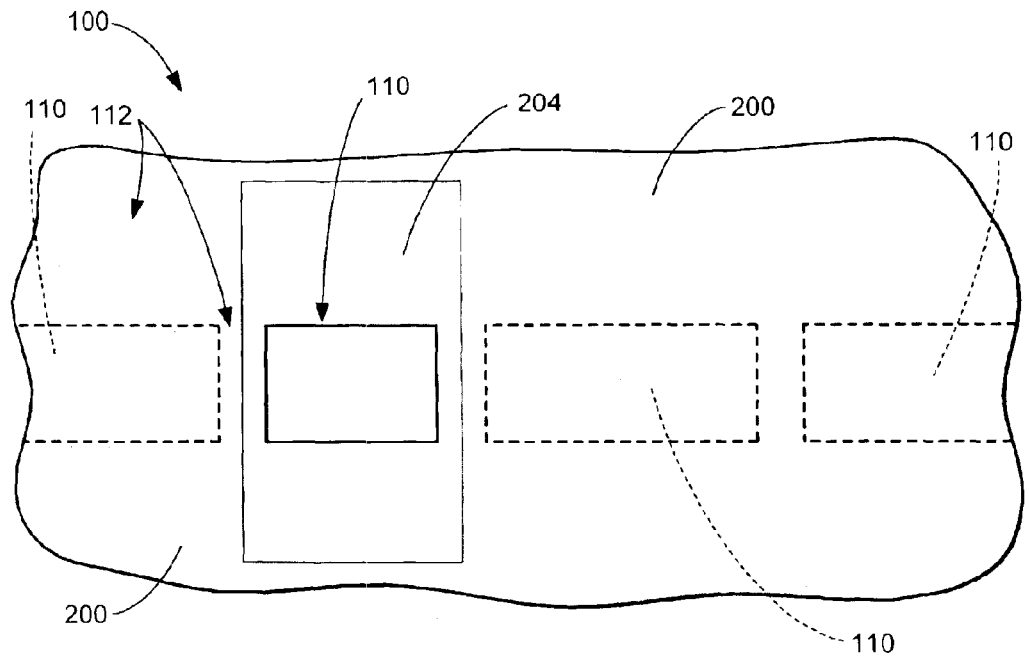
FIG. 2B is a layout view of the structure of FIG. 2A.
Figure 2A:
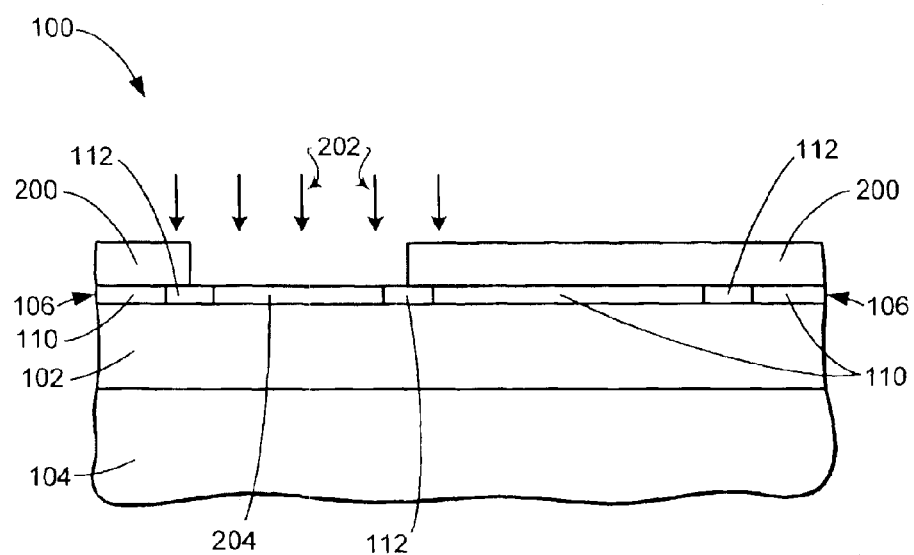
FIG. 2A is the structure of FIG. 1A following formation of isolation regions, removal of a first mask, and formation of a second mask.

Referring now to FIG. 2A, therein is shown the structure of FIG. 1A following formation of the isolation regions 112 and removal of the mask 108 (FIG. 1A). A mask 200 has been patterned and formed on the upper layer 106 (FIG. 1A) for N– dopant implantation, illustrated by implantation arrows 202, to form an N– implantation 204. (For clarity of illustration, the N– implantation 204 as shown in FIG. 2A is referenced only in its corresponding active area.)

Referring now to FIG. 2B, therein is shown a layout view of the structure of FIG. 2A.

Figure 3B:
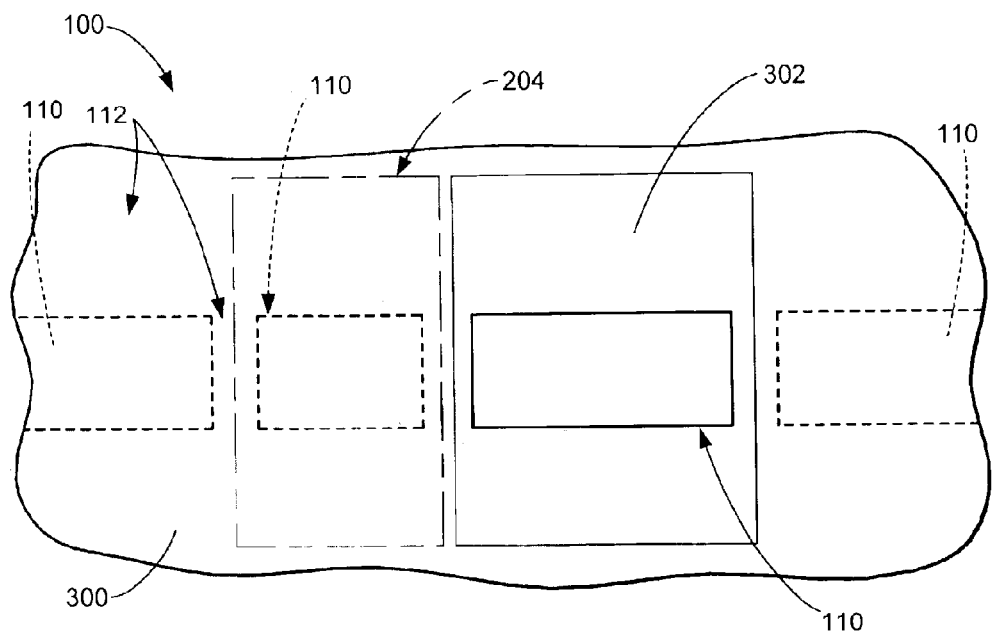
FIG. 3B is a layout view of the structure of FIG. 3A.
Figure 3A:
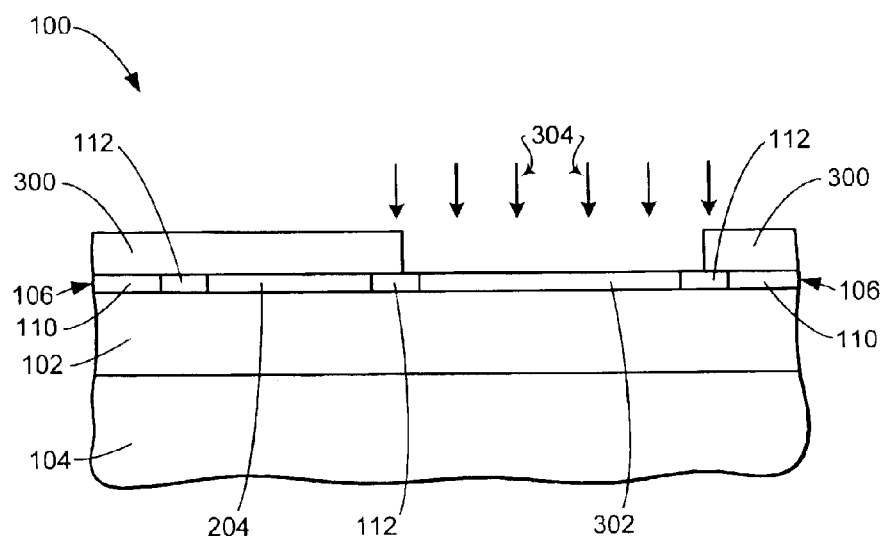
FIG. 3A is the structure of FIG. 2A after removal of the second mask and formation of a third mask in accordance with the present invention.

Referring now to FIG. 3A, therein is shown the structure of FIG. 2A after the mask 200 (FIG. 2A) has been removed and a mask 300 has been patterned and formed on the upper layer 106. The mask 300 defines the area for a P– implantation 302, illustrated by implantation arrows 304. (For clarity of illustration, the P– implantation 302 as shown in FIG. 3A is referenced only in its corresponding active area.)

Referring now to FIG. 3B, therein is shown a layout view of the structure of FIG. 3A.

Figure 4B:
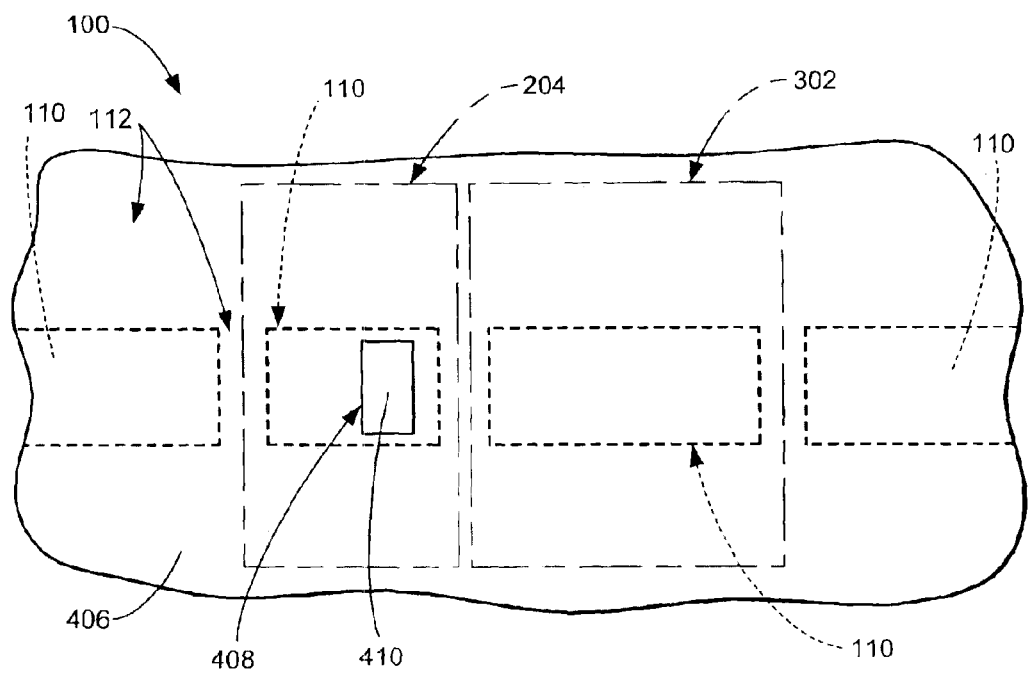
FIG. 4B is a layout view of the structure of FIG. 4A.
Figure 4A:
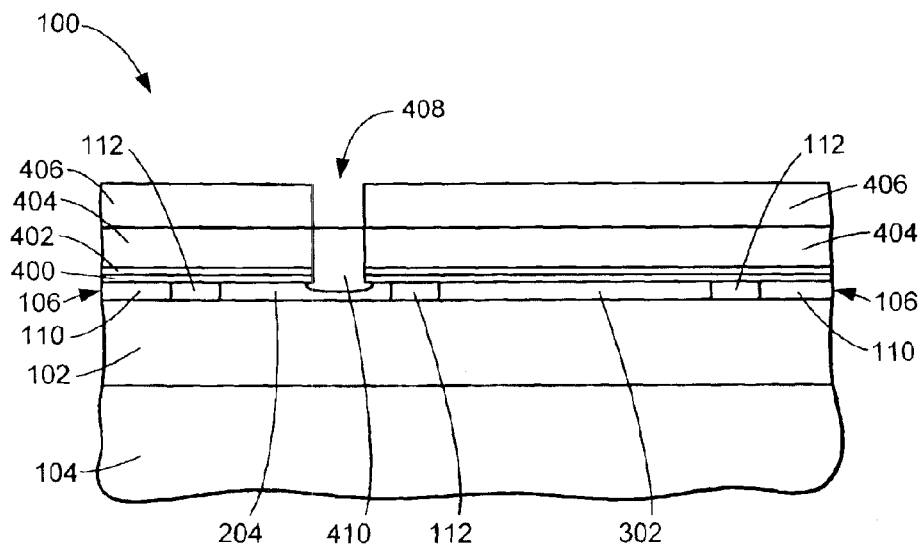
FIG. 4A is the structure of FIG. 3A after removal of the third mask, deposition of several layers, formation of a fourth mask, and formation of a silicon pillar, in accordance with the present invention.

Referring now to FIG. 4A, therein is shown the structure of FIG. 3A following removal of the mask 300 (FIG. 3A), deposition of a lower, thin SiO$_2$ layer 400 on the upper layer 106, deposition of a thin silicon nitride ("Si$_3$N$_4$") layer 402 on the thin SiO$_2$ layer 400, and deposition of an upper, thicker SiO$_2$ layer 404 on the thin Si$_3$N$_4$ layer 402.

A mask 406 has then been patterned and formed on the thicker SiO$_2$ layer 404. The mask 406 has a hole 408 therein located over the region of the N– implantation 204.

Following formation of the mask 406, the portions of the upper layer 106, the thin SiO$_2$ layer 400, the thin Si$_3$N$_4$ layer 402, and the thicker SiO$_2$ layer 404 beneath the hole 408 are etched through the hole 408. This can be advantageously done in several steps. By using the thin Si$_3$N$_4$ layer 402 as an etch stop for the thicker SiO$_2$ layer 404, a relatively high etch rate can be used for the thicker SiO$_2$ layer 404. Then, after the thin Si$_3$N$_4$ layer 402 has been etched through, a slower etch rate can be used when etching the thin SiO$_2$ layer 400.

Following the etching, the mask 406 is removed and a P– Si pillar 410 is grown by selective epitaxy in the etched region below the hole 408.

Referring now to FIG. 4B, therein is shown a layout view of the structure of FIG. 4A.

Figure 5B:
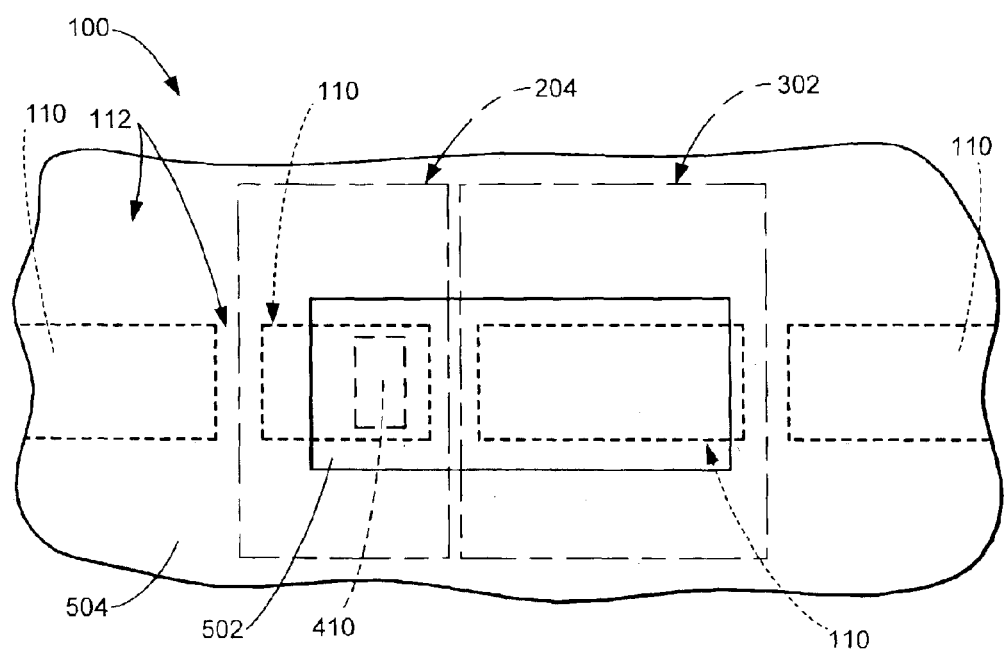
FIG. 5B is a layout view of the structure of FIG. 5A.
Figure 5A:
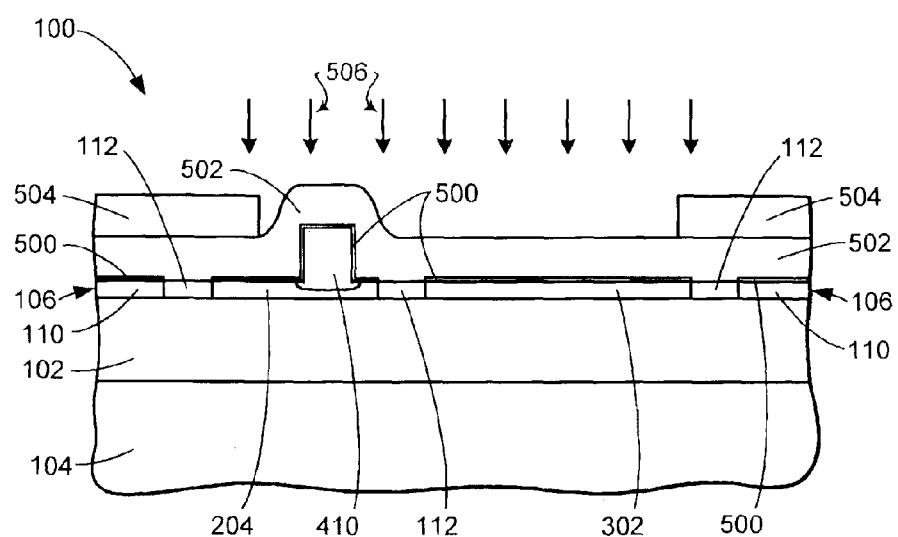
FIG. 5A is the structure of FIG. 4A after removal of the fourth mask, chemical-mechanical planarization, removal of the several layers, formation of an additional layer, and formation of a fifth mask in accordance with the present invention.

Referring now to FIG. 5A, therein is shown the structure of FIG. 4A following reduction by chemical-mechanical planarization ("CMP") of the height of the P– Si pillar 410 to the height of the top of the thicker SiO$_2$ layer 404 (FIG. 4A).

The thin SiO$_2$ layer 400 (FIG. 4A), the thin Si$_3$N$_4$ layer 402 (FIG. 4A), and the thicker SiO$_2$ layer 404 have then been stripped off following the CMP. Advantageously, the thin Si$_3$N$_4$ layer 402 allows for faster stripping of the thicker SiO$_2$ layer 404 because it blocks the etchant from the thin SiO$_2$ layer 400 and the isolation regions 112 below the thin Si$_3$N$_4$ layer 402. Then, after removing the thin Si$_3$N$_4$ layer 402, a slower-etch-rate etchant can be used for the removal of the thin SiO$_2$ layer 400, so that not too much of the isolation regions 112 therebelow is removed.

Next, a gate oxide 500 has been grown through conventional oxide growth processes such as thermal oxidation. The gate oxide 500 is grown on all exposed Si regions, including the P– Si pillar 410.

Figure 6B:
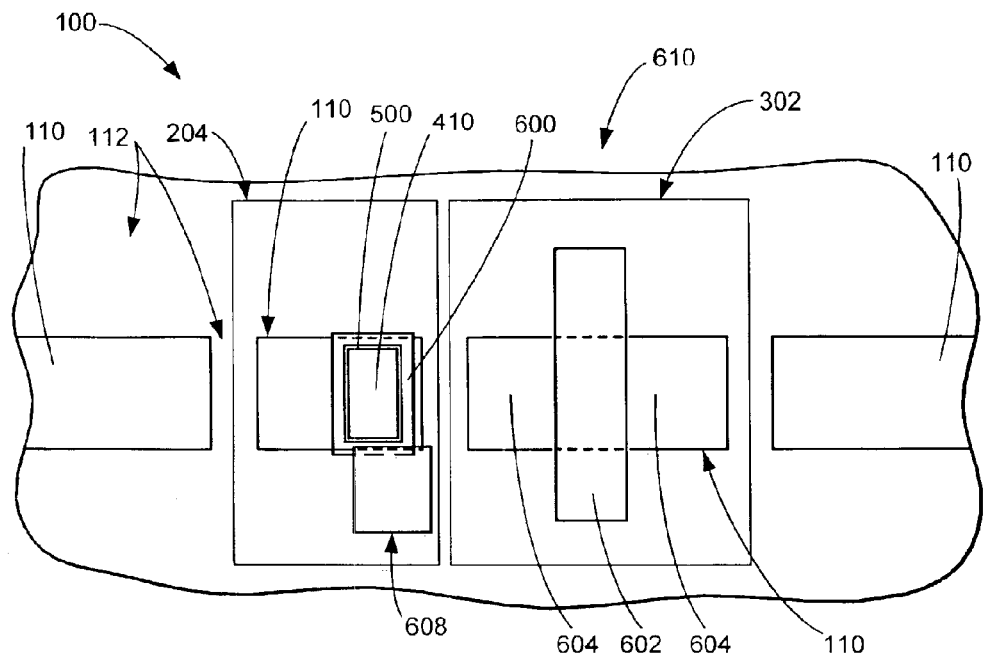
FIG. 6B is a layout view of the structure of FIG. 6A.

A polysilicon layer 502 has then been formed over the P-Si pillar 410 and the remainder of the upper layer 106. The polysilicon layer 502, as shown in FIGS. 6A and 6B, will subsequently be formed to serve as gate material.

A mask 504 has been patterned and formed on the polysilicon layer 502, and the portion of the polysilicon layer 502 around the P—Si pillar 410 and not protected by the mask 504 has been implanted with a dopant, as indicated by implantation arrows 506. As an example, the dopant could be phosphorus, with an implant dose from 1E15 to 7.5E15 per cm$^2$.

Referring now to FIG. 5B, therein is shown a layout view of the structure of FIG. 5A, with the gate oxide 500 omitted for clarity of illustration.

Figure 6A:
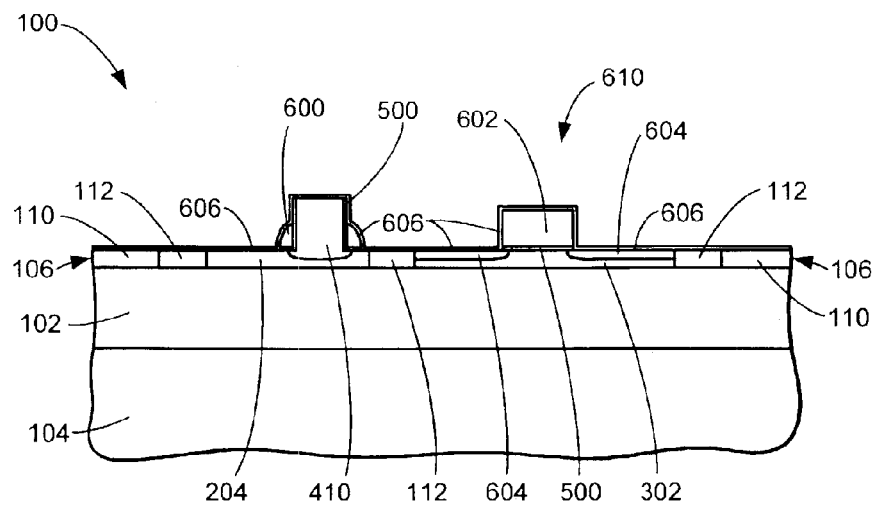
FIG. 6A is the structure of FIG. 5A after removal of the fifth mask, etching, and formation of gates in accordance with the present invention.

Referring now to FIG. 6A, therein is shown the structure of FIG. 5A following removal of the mask 504 (FIG. 5A) and anisotropic etching of the polysilicon layer 502 (FIG. 5A) to form a thyristor polysilicon surround gate 600 adjacent and around the P– Si pillar 410, and to form an access transistor gate 602 over the gate oxide 500 on the P– implantation 302.

Using conventional masking and implantation processes such as those described above, N– source/drain areas 604 have then been formed in the P– implantation 302 on either side of the access transistor gate 602 and the gate oxide 500 therebeneath, completing the core components of the negative-channel metal-oxide semiconductor ("NMOS") access transistor 610.

Using conventional tetraethylorthosilicate ("TEOS") deposition processes, an SiO$_2$ layer 606 has then been formed over all the various structures on the Si wafer 100, including on the sides of the thyristor polysilicon surround gate 600, the sides of the P– Si pillar 410 above the thyristor polysilicon surround gate 600, and the sides of the access transistor gate 602.

Referring now to FIG. 6B, therein is shown a layout view of the structure of FIG. 6A, with the SiO$_2$ layer 606 omitted for clarity of illustration. Also shown in FIG. 6B is the formation of a polysilicon connection 608 for the thyristor polysilicon surround gate 600. The polysilicon connection 608 furnishes adequate spacing and electrical continuity for the, later formation of a laterally displaced electrical contact 810 (see FIG. 8B) for connecting electrically to the thyristor polysilicon surround gate 600.

Figure 7B:
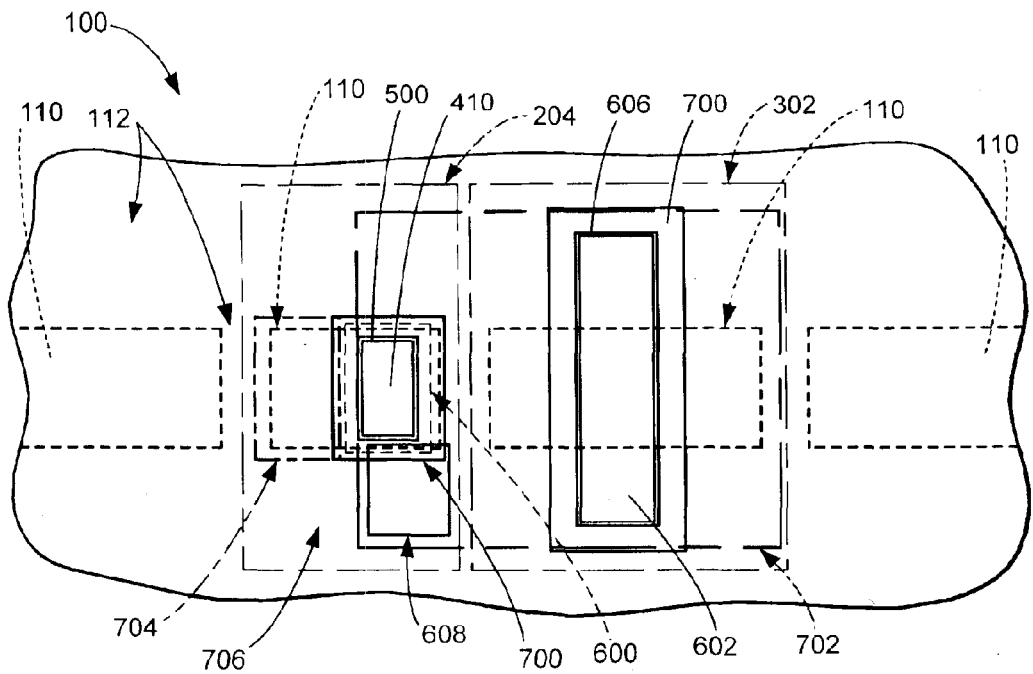
FIG. 7B is a layout view of the structure of FIG. 7A.
Figure 7A:
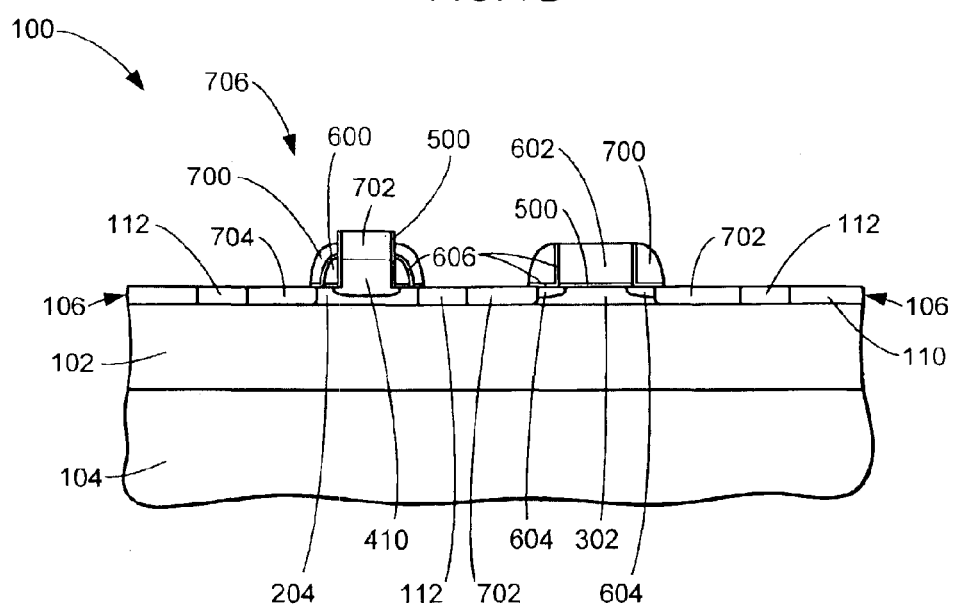
FIG. 7A is the structure of FIG. 6A after formation of nitride spacers over a TEOS layer in accordance with the present invention.

Referring now to FIG. 7A, therein is shown the structure of FIG. 6A following the formation of a nitride spacer 700 over the portion of the SiO$_2$ layer 606 that is around the P– Si pillar 410. The nitride spacer 700 is also formed around the portion of the SiO$_2$ layer 606 that is around the access transistor gate 602. The nitride spacers 700 are formed by conventional deposition processes, followed by anisotropic etching that stops on the SiO$_2$ layer 606.

Then, again using conventional masking and implantation steps, the N– source/drain areas 604 adjacent and outside the nitride spacer 700, the top of the P– Si pillar 410, and the top of the access transistor gate 602 each receive an N+ implantation 702.

Similarly, the N– implantation 204 adjacent and outside the nitride spacer 700 around the P– Si pillar 410 receives a P+ implantation 704, using the nitride spacer 700 around the P– Si pillar 410 to self-align the P+ implantation 704. This completes the core components of the thyristor 706, consisting of the P– Si pillar 410, the N+ implantation 702 on the top thereof, the N-implantation 204 under and adjacent the P-Si pillar 410, and the P+ implantation 704 thereadjacent.

The resulting thyristor device has the four layers just described, forming three P-N junctions between the layers. Two of the layers (the P+ implantation 704 and the N– implantation 204 adjacent thereto) are formed horizontally on the semiconductor substrate (in the upper layer 106 of Si), and three of the layers (the same N– implantation 204, the lower portion of the P– Si pillar 410, and the N+ implantation 702 on the top thereof) are formed vertically below and in the silicon pillar on the semiconductor substrate.

A rapid thermal anneal ("RTA") is then performed to activate the various implantation dopants. The implant energy of the N+ implantation 702 into the N– source/drain areas 604 and the RTA temperature and time are chosen such that the N+ junction on the Si pillar overlaps with the thyristor polysilicon surround gate 600 sufficiently for the latter to function as a gate.

Referring now to FIG. 7B, therein is shown a layout view of the structure of FIG. 7A.

Figure 8B:
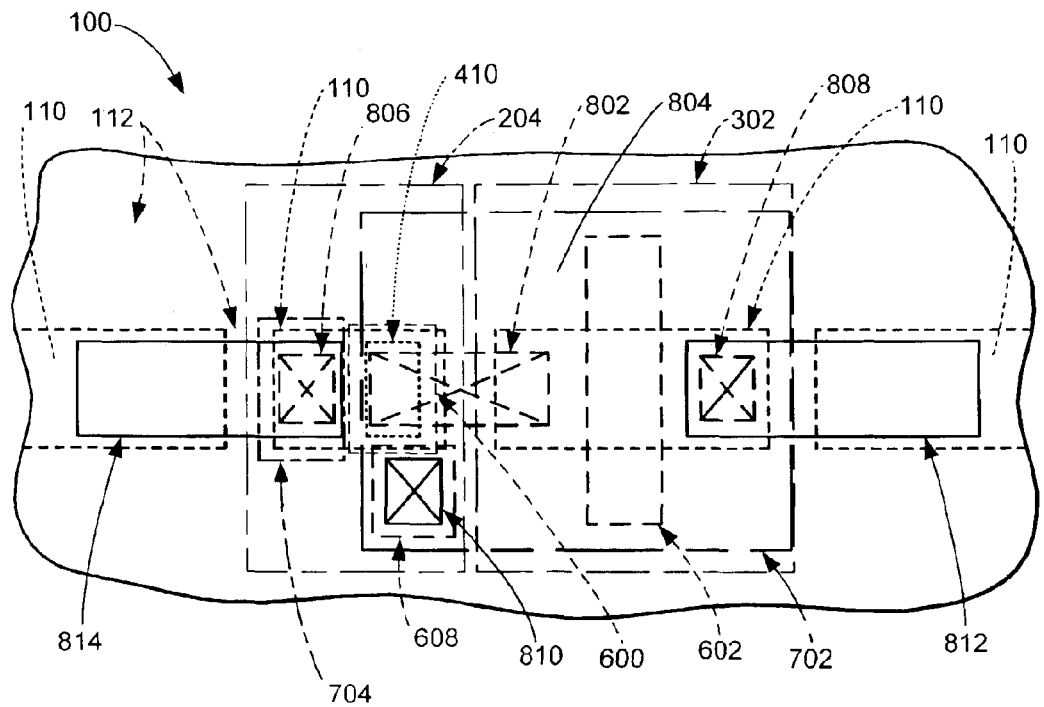
FIG. 8B is a layout view of the structure of FIG. 8A.
Figure 8A:
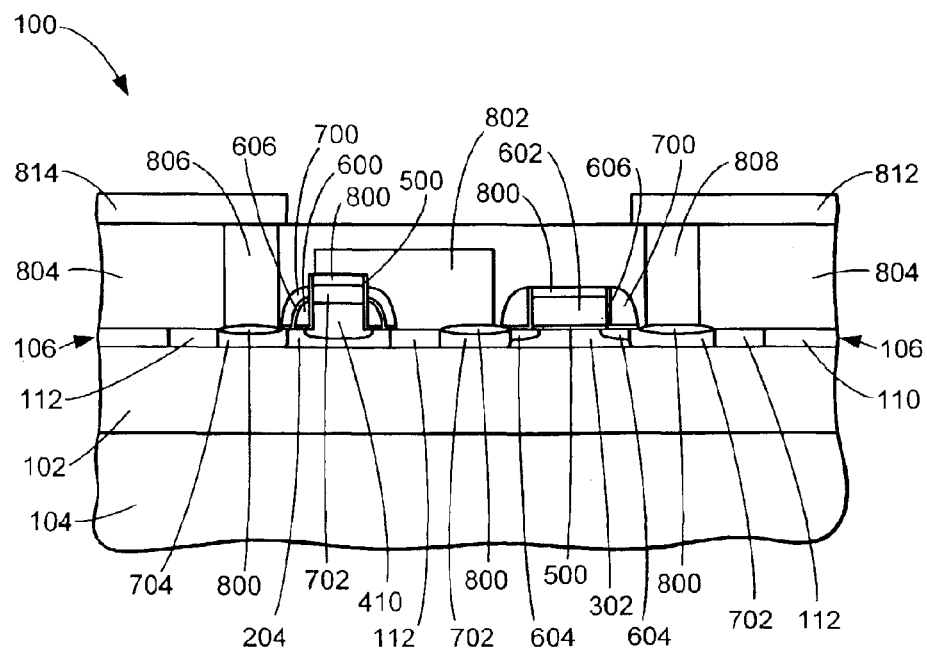
FIG. 8A is the structure of FIG. 7A after deposition of a salicide layer on the N+ and P+ implantations, formation of an interlayer dielectric layer, and provision of electrical contacts, in accordance with the present invention.

Referring now to FIG. 8A, therein is shown the structure of FIG. 7A following formation of a salicide layer 800 respectively on each of the N+ implantations 702 and the P+ implantation 704.

Then a local interconnect 802 is formed between the thyristor pillar and the access control transistor. The local interconnect 802 is formed in conventional fashion, for example, by first depositing an intermediate interlayer dielectric layer ("ILD"), which is then planarized, then patterned and etched. Suitable metals and barrier materials are then used to fill the trenches thus formed, and then CMP'd flush with the top of the intermediate ILD.

The device is then completed by formation of an ILD 804 over the various structures on the Si wafer 100. The ILD 804 is formed by "topping up" to the ultimate ILD thickness by deposition of dielectric. Then (among other conventional finishing steps) electrical contacts 806, 808, and 810 (FIG. 8B) are formed through the ILD 804.

The ILD 804 and the electrical contacts 806, 808, and 810 are then finished with CMP and other conventional finishing steps. Metal lines, such as for a bit line 812 and a V$_{ref}$ 814, are then formed and connected to the several electrical contacts 806, 808 and 810.

The thyristor-based SRAM (T-RAM) cell thus consists of two elements: the PNPN-type NDR device and the NMOS-type access transistor, connected by the local interconnect 802.

Referring now to FIG. 8B, therein is shown a layout view of the structure of FIG. 8A, with portions omitted for clarity of illustration.

Figure 9:
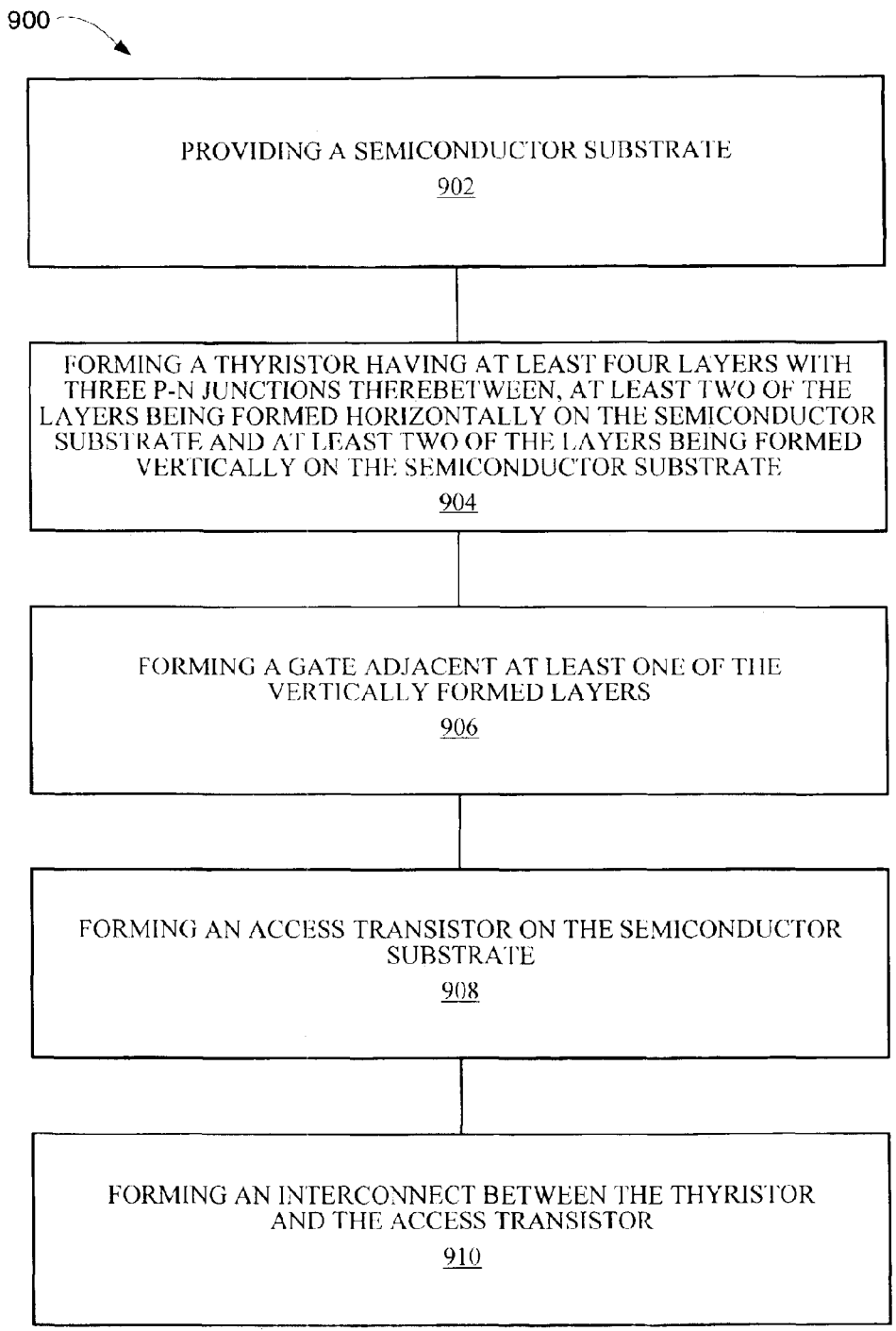
FIG. 9 is a flow chart of a method for providing and fabricating a thyristor-based SRAM in accordance with the present invention.

Referring now to FIG. 9, therein is shown a flow chart of a method 900 for providing a thyristor-based SRAM integrated circuit structure and method for the fabrication thereof in accordance with the present invention. The method includes a step 902 of providing a semiconductor substrate; a step 904 of forming a thyristor having at least four layers with three P-N junctions therebetween, at least two of the layers being formed horizontally on the semiconductor substrate and at least two of the layers being formed vertically on the semiconductor substrate; a step 906 of forming a gate adjacent at least one of the vertically formed layers; a step 908 of forming an access transistor on the semiconductor substrate; and a step 910 of forming an interconnect between the thyristor and the access transistor.

In greater detail, a manufacturing method to produce the thyristor-based SRAM is performed as follows:

1. The Si semiconductor substrate 104 is suitably prepared to provide an SOI region including the buried SiO$_2$ 102 and the upper layer 106 of Si. The mask 108 is patterned and formed on the upper layer 106 of Si for defining the isolation regions 112. (FIGS. 1A and 1B)

2. The isolation regions 112 are formed, such as by depositing SiO$_2$ in those portions of the upper layer 106 of Si not protected by the mask 108. The mask 108 is then removed, and the mask 200 is patterned and formed over the upper layer 106 to define the region for the N– implantation 204 (indicated by the implantation arrows 202). (FIGS. 2A and 2B)

3. The mask 200 (FIG. 2A) is then removed and the mask 300 is patterned and formed over the upper layer 106 to define the regions for the P– implantation 302 (illustrated by the implantation arrows 304). (FIGS. 3A and 3B)

4. The mask 300 (FIG. 3A) is next removed and the thin SiO$_2$ layer 400 is formed on the upper layer 106. The thin Si$_3$N$_4$ layer 402 is then formed over the thin SiO$_2$ layer 400, and the thicker SiO$_2$ layer 404 is formed over the thin Si$_3$N$_4$ layer 402. Together, the layers 400, 402, and 404 define the height of the P– Si pillar 410 which will be formed in the hole 408 defined by the mask 406. Next, the layers 400, 402, and 404 are then etched through the hole 408, following which the mask 406 is removed and the P– Si pillar 410 is grown in the resulting hole 408 by selective epitaxy. (FIGS. 4A and 4B)

5. The height of the P– Si pillar 410 is reduced by CMP to the height of the top of the thicker SiO$_2$ layer 404 (FIG. 4A). The oxide/nitride/oxide stack defined by the layers 400, 402, and 404 is then stripped off following the CMP. The gate oxide 500 is grown, and the polysilicon layer 502 is then formed thereover. The mask 504 is patterned and formed on the polysilicon layer 502, following which the region of the polysilicon layer 502 over and around the P– Si pillar 410 is implanted, as indicated by the implantation arrows 506. (FIGS. 5A and 5B)

6. The mask 504 (FIG. 5A) is removed, and the polysilicon layer 502 is etched anisotropically to form the thyristor polysilicon surround gate 600 and the access transistor gate 602. The N– source/drain areas 604 are then formed by masking and implantation, following which the SiO$_2$ layer 606 is deposited. (FIGS. 6A and 6B)

7. The nitride spacers 700 are formed by a deposition and etch, stopping on the SiO$_2$ layer 606. The N+ implantation 702 is then provided by suitable masking and implantation. Also, by using the nitride spacer 700 around the P—Si pillar 410 to self-align, the P+ implantation 704 for the thyristor is formed adjacent the nitride spacer 700 thereat. The RTA is then performed to activate the implantation dopants. (FIGS. 7A and 7B)

8. By suitable deposition and thermal cycles, the salicide layer 800 is formed on the N+ implantations 702 (source/drain areas), the access transistor gate 602, and the P+ implantation 704 (source/drain areas). The local interconnect 802 is then formed, following which the ILD 804 is formed and the electrical contacts 806, 808, and 810 are formed through the ILD 804. This is followed by additional conventional finishing steps, such as interconnect formation, including formation of the bit line 812 and formation of the V$_{ref}$ 814. (FIGS. 8A and 8B)

It has been discovered that the present invention has numerous advantages. Principal among these is that the contacts can be formed with relatively little height difference.

Another advantage is the relatively low number of implantation steps. Still another advantage is the compatibility of the present invention with salicidation, thereby allowing for better contact resistance.

An additional advantage is the capacitively-coupled thyristor polysilicon surround gate 600 adjacent to the Si pillar of the thyristor, which results in improved speed of the thyristor current switching when a voltage transition is presented at the thyristor polysilicon surround gate 600.

The resulting thyristor and access transistor configurations, coupled through the local interconnect 802, form a T-RAM that, although employing a pillar configuration, exhibits the advantageous limited height differential that alleviates contact formation problems.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method for manufacturing an integrated circuit structure, comprising:

providing a semiconductor substrate;

forming a thyristor having at least four layers with three P—N junctions therebetween, at least two of the layers being formed horizontally on the semiconductor substrate and at least two of the layers being formed vertically on the semiconductor substrate;

forming a gate adjacent at least one of the vertically formed layers;

forming an access transistor on the semiconductor substrate; and forming an interconnect between the thyristor and the access transistor.

2. The method of claim 1 wherein providing the semiconductor substrate includes providing a semiconductor-on-insulator substrate.

3. The method of claim 1 wherein forming the thyristor includes forming at least two of the vertical layers in a vertical pillar on the semiconductor substrate.

4. The method of claim 3 wherein forming the gate includes forming a surround gate around the vertical pillar.

5. The method of claim 3 wherein forming the interconnect includes forming a local interconnect above the semiconductor substrate connecting the pillar and the access transistor.

6. A method for manufacturing an integrated circuit structure, comprising:

providing an underlying silicon semiconductor substrate;

forming a layer of buried silicon oxide on the underlying silicon semiconductor substrate;

forming an upper layer of silicon on the layer of buried silicon oxide;

implanting N– and P– regions in the upper layer of silicon;

depositing at least one additional layer on the upper layer of silicon;

etching the additional layer to form a hole therein over the N– implantation region;

growing a vertical P-type silicon pillar in the hole by selective epitaxy;

stripping off the additional layer;

growing gate oxide around the sides of the P– Si pillar and over the P– implantation region;

forming a polysilicon gate over the gate oxide in the P– implantation region;

forming and implanting a polysilicon gate adjacent the P– Si pillar;

implanting N– source/drain areas adjacent the polysilicon gate over the P– implantation region;

depositing nitride spacers around at least one of the polysilicon gates and the P– Si pillar;

forming N+ implantations in the N– source/drain areas, in the top of the P– Si pillar, and in the top of the polysilicon gate over the P– implantation region;

forming a P+ implantation in the N– implantation adjacent the P– Si pillar, using the nitride spacer around the P– Si pillar to self-align the P+ implantation threadjacent;

forming respective salicide layers over the N+ and P+ implantations; and forming an interconnect between the salicide layer over the top of the P– Si pillar and one of the salicide layers over the N– source/drain areas.

7. The method of claim 6 wherein forming the gate adjacent the P– Si pillar includes forming a surround gate around the vertical P– Si pillar.

8. The method of claim 6 further comprising activating the implantations by rapid thermal anneal.

9. The method of claim 6 wherein forming the interconnect includes forming a local interconnect above the semiconductor substrate.

10. The method of claim 6 further comprising:

depositing an interlayer dielectric; and forming electrical contacts through the interlayer dielectric to a plurality of the salicide layers.

* * * * *